(12) United States Patent
Fei et al.

(10) Patent No.: US 9,633,937 B2
(45) Date of Patent: Apr. 25, 2017

(54) ELECTRONIC ASSEMBLY THAT INCLUDES STACKED ELECTRONIC DEVICES

(71) Applicant: Intel Corporation, Santa Clara, CA (US)

(72) Inventors: Huiyang Fei, Chandler, AZ (US); Prasanna Raghavan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/778,128

(22) PCT Filed: Dec. 16, 2014

(86) PCT No.: PCT/US2014/070640
§ 371 (c)(1),
(2) Date: Sep. 18, 2015

(87) PCT Pub. No.: WO2016/099463
PCT Pub. Date: Jun. 23, 2016

(65) Prior Publication Data
US 2016/0225707 A1   Aug. 4, 2016

(51) Int. Cl.
*H01L 23/48* (2006.01)
*H01L 23/52* (2006.01)
(Continued)

(52) U.S. Cl.
CPC .... *H01L 23/49833* (2013.01); *H01L 21/4853* (2013.01); *H01L 21/565* (2013.01);
(Continued)

(58) Field of Classification Search
USPC ............ 257/737, 738, E21.502, 777, 686, 257/E23.021, E25.027; 438/613, 15
See application file for complete search history.

(56) References Cited

U.S. PATENT DOCUMENTS 7,687,899 B1 *  3/2010  Berry ................... H01L 21/561
                                                                257/687
7,872,343 B1    1/2011  Berry
(Continued)

FOREIGN PATENT DOCUMENTS

CN      101211900 A    7/2008
JP      2008159955 A   7/2008
(Continued)

OTHER PUBLICATIONS

"International Application Serial No. PCT/US2014/070640, International Search Report mailed Aug. 31, 2015", 3 pgs.
(Continued)

*Primary Examiner* — Dao H Nguyen
*Assistant Examiner* — Tram H Nguyen
(74) *Attorney, Agent, or Firm* — Schwegman Lundberg & Woessner, P.A.

(57) ABSTRACT

The electronic package includes a substrate and an electronic component mounted to a surface of the substrate. An interposer is mounted to the surface of the substrate such that the interposer surrounds the electronic component and is electrically connected to the substrate. An over-mold covers the electronic component. In other forms, the example electronic package may be incorporated into an electronic assembly. The electronic assembly further includes a second electronic component mounted to the interposer. As an example, the second electronic component may be mounted to the interposer using solder bumps. It should be noted that any technique that is known now, or discovered in the future, may be used to mount the second electronic component to the interposer.

15 Claims, 5 Drawing Sheets

(51) Int. Cl.
    *H01L 29/40*     (2006.01)
    *H01L 23/498*     (2006.01)
    *H01L 23/13*     (2006.01)
    *H01L 23/16*     (2006.01)
    *H01L 25/065*     (2006.01)
    *H01L 25/18*     (2006.01)
    *H01L 25/00*     (2006.01)
    *H01L 21/48*     (2006.01)
    *H01L 21/56*     (2006.01)
    *H01L 23/29*     (2006.01)
    *H01L 23/31*     (2006.01)
    *H01L 23/00*     (2006.01)

(52) U.S. Cl.
    CPC .............. *H01L 23/13* (2013.01); *H01L 23/16* (2013.01); *H01L 23/293* (2013.01); *H01L 23/3128* (2013.01); *H01L 23/49827* (2013.01); *H01L 23/49883* (2013.01); *H01L 24/17* (2013.01); *H01L 24/81* (2013.01); *H01L 25/0657* (2013.01); *H01L 25/18* (2013.01); *H01L 25/50* (2013.01); *H01L 23/49816* (2013.01); *H01L 24/13* (2013.01); *H01L 24/16* (2013.01); *H01L 2224/131* (2013.01); *H01L 2224/16145* (2013.01); *H01L 2224/16227* (2013.01); *H01L 2224/1703* (2013.01); *H01L 2224/17181* (2013.01); *H01L 2225/0652* (2013.01); *H01L 2225/06513* (2013.01); *H01L 2225/06517* (2013.01); *H01L 2225/06555* (2013.01); *H01L 2225/06572* (2013.01); *H01L 2924/14* (2013.01); *H01L 2924/1436* (2013.01); *H01L 2924/15311* (2013.01); *H01L 2924/15331* (2013.01); *H01L 2924/3511* (2013.01); *H01L 2924/37001* (2013.01); *H01L 2924/384* (2013.01)

(56) References Cited

U.S. PATENT DOCUMENTS

| | | | |
|---|---|---|---|
| 2002/0054486 A1* | 5/2002 | Miyajima | .............. H05K 1/141 361/803 |
| 2003/0042587 A1* | 3/2003 | Lee | ..................... H01L 25/0657 257/678 |
| 2004/0106229 A1* | 6/2004 | Jiang | ................... H01L 23/3128 438/106 |
| 2006/0001179 A1* | 1/2006 | Fukase | .................. H01L 23/147 257/778 |
| 2008/0128884 A1 | 6/2008 | Meyer et al. | |
| 2008/0174977 A1 | 7/2008 | Inoue | |
| 2008/0258289 A1 | 10/2008 | Pendse et al. | |
| 2009/0166886 A1 | 7/2009 | Kim et al. | |
| 2011/0068459 A1* | 3/2011 | Pagaila | .................. H01L 21/568 257/698 |
| 2012/0146243 A1 | 6/2012 | Song et al. | |
| 2012/0241925 A1* | 9/2012 | Yoon | ..................... H01L 21/563 257/666 |
| 2013/0161836 A1 | 6/2013 | Yeom et al. | |
| 2014/0263585 A1* | 9/2014 | Sweere | ................... H01L 24/17 228/180.22 |
| 2014/0312481 A1* | 10/2014 | Choi | ....................... H01L 25/50 257/686 |
| 2016/0056087 A1* | 2/2016 | Wu | ................... H01L 23/49816 257/738 |

FOREIGN PATENT DOCUMENTS

| | | |
|---|---|---|
| JP | 2008294330 A | 12/2008 |
| KR | 1020080060167 A | 7/2008 |
| KR | 20130033375 | 4/2013 |
| KR | 1020130075251 A | 7/2013 |
| TW | 200832674 A | 8/2008 |
| WO | WO-2016099463 A1 | 6/2016 |

OTHER PUBLICATIONS

"International Application Serial No. PCT/US2014/070640, Written Opinion mailed Aug. 31, 2015", 6 pgs.

"Japanese Application Serial No. 2016-565092, Office Action mailed Jan. 17, 2017", W/ English Translation, 8 pgs.

"Korean Application Serial No. 2015-7032529, Office Action mailed Dec. 2, 2016", w/ English Translation, 13 pgs.

* cited by examiner

ELECTRONIC ASSEMBLY THAT INCLUDES STACKED ELECTRONIC DEVICES

This application is a U.S. National Stage Application under 35 U.S.C. 371 from International Application No. PCT/US2014/070640, filed Dec. 16, 2014, which is hereby incorporated by reference in its entirety.

TECHNICAL FIELD

Embodiments described herein generally relate to electronic assemblies, and more particularly to electronic assemblies that include stacked electronic devices.

BACKGROUND

Two of the biggest challenges in developing next generation packaging technologies are package warpage reduction and package thickness reduction. These challenges are due to the ever increasing demand in the consumer microelectronic market for smaller and thinner devices.

Currently in chip scale packages (CSP) with molded underfill (MUF), an over-mold is used to try to control package warpage. In addition, Through-Mold-Interconnect (TMI) is usually used to connect an electronic package in a package-on-package configuration with other electronic devices/packages (e.g., DRAM).

There are several drawbacks that are associated with conventional over-mold plus TMI electronic packaging solutions. These drawbacks are due to manufacturing considerations that are associated with (i) relatively high temperatures during fabrication of the electronic packages; and (ii) smaller form factors for the electronic packages.

One of the drawbacks relates to high warpage due to relatively high temperatures that occur during fabrication of electronic packages. Utilizing over-mold as a warpage solution requires ultrathin dies and relatively thick over-mold to achieve reduced warpage.

An electronic package is typically very sensitive to warpage during molding processes because of the existence of large amount of mold material in the electronic package. When there is a relatively large amount of over-mold and relatively little silicon, the electronic package commonly becomes "floppy" resulting in relatively large variations in electronic package shape and warpage magnitude.

Another of the drawbacks relates finding a proper mold material for different types of electronic packages. Electronic packages may differ in size and/or form factor. One important consideration when over-molding is balancing the bottom half of the electronic package with the over-mold.

As an example, a die area may have a very different stiffness and thermal expansion coefficient than a non-die area. Therefore, when the electronic package geometry changes, the over-mold material and over-mold thickness may need to be reconfigured.

There is no universal over-mold solution for different types of electronic packages. Changing over-mold materials for each type of electronic package does not promote efficient manufacturing of electronic packages.

Another of the drawbacks relates to surface mounting (SMT) DRAM utilizing top side ball attach (TSBA), which often causes concern related to solder joint quality (SJQ) and solder joint reliability (SJR). A relatively thick over-mold may alleviate electronic package warpage but may also make mounting DRAM using SMT more difficult. Attaching DRAM using SMT may be more difficult because the through mold interconnect (TMI) hole may be too deep for a DRAM solder ball to connect with a solder ball on a top side of the substrate.

One solution is to raise the top side solder ball height. As an example, a reconfigured TSBA may raise the top side solder ball height from 210 um to 260 um. After the DRAM ball and TSBA ball merge together, the final joint height may be undesirably high (i.e., over 400 um). This reconfiguration causes a relatively thin and tall TMI joint that may have diminished SJQ and SJR, especially during temperature cycling which may occur during fabrication and use of the electronic package.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Some of the example electronic packages, electronic assemblies and methods described herein include an interposer. The interposer is mounted about a periphery of an electronic component that is mounted onto a substrate. The electronic component is then over-molded to produce the electronic package.

As an example, the interposer may serve as a bridge between the substrate and DRAM as well acting as a stiffener to support the electronic package periphery. The example electronic packages, electronic assemblies and methods described may improve DRAM yield when using SMT, warpage variation, TSBA yield and SJR. In addition, the pitch of the interconnects that are between the interposer and substrate may be smaller than the pitch of conventional electronic package, especially if thermal compression bonding (TCB) is used to attach the interposer to the substrate.

Figure 1:
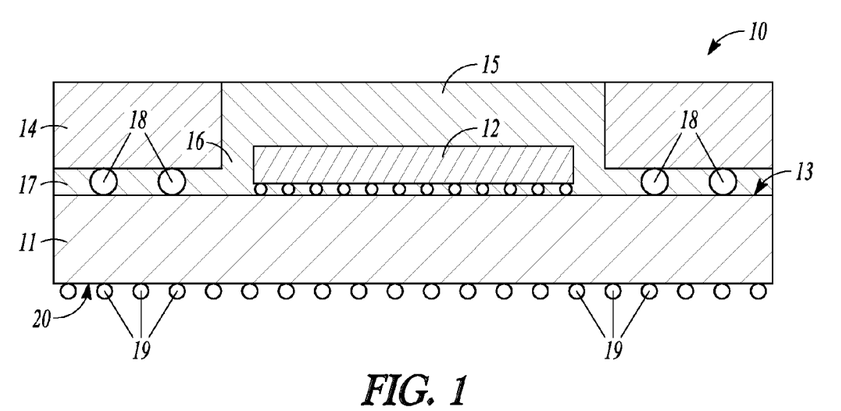
FIG. 1 shows a schematic section view of an example electronic package.
Figure 2:
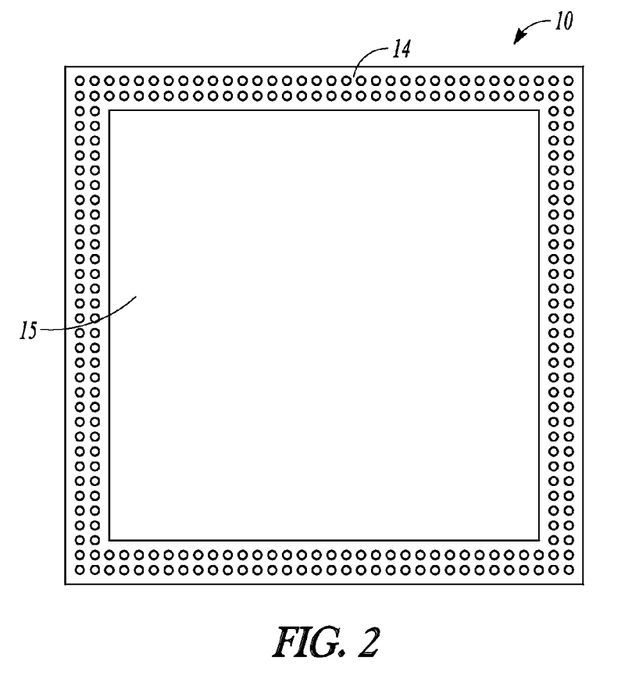
FIG. 2 show a top view of the electronic package illustrated in FIG. 1.

FIG. 1 shows a schematic section view of an example electronic package 10. FIG. 2 show a top view of the electronic package 10 illustrated in FIG. 1.

The electronic package 10 includes a substrate 11 and an electronic component 12 mounted to a surface 13 of the substrate 11. An interposer 14 is mounted to the surface 13 of the substrate 11 such that the interposer 14 surrounds the electronic component 12 and is electrically connected to the substrate 11. An over-mold 15 covers the electronic component 12.

As an example, the substrate 11 may be a motherboard. It should be noted that the substrate 11 may be any type of substrate (e.g., a die or integrated circuit) that is known now or discovered in the future.

In some forms, the interposer 14 may be formed of organic polymers, fibers and conductors. The size and type of material that are selected for the interposer 14 will depend in part on (i) the type and size of the electronic component 12; (ii) the type of substrate 11; and/or (iii) the desired size and functionality of the electronic package 10 (among other factors).

The over-mold 15 may be formed of a polymer (although other materials are contemplated). In addition, the over-mold 15 may fill an area 16 between the electronic component 12 and the interposer 14 and may fill an area 17 between the interposer 14 and the substrate 11.

In some forms of the electronic package 10, the electronic component 12 may be electrically connected to the interposer 14 through the substrate 11. In addition, the interposer 14 may be mounted to the substrate using solder bumps 18, or any other technique that is known now or discovered in the future.

The electronic package 10 may further include solder bumps 19 mounted to an opposing surface 20 of the substrate 11. The solder bumps 19 may be used to mount (and electrically connect) the electronic package 10 to another electronic device (not shown). The number, size and arrangement of the solder balls 19 will depend in part on the configuration of the electronic device that receives the electronic package 10 (among other factors).

In some forms of the electronic package 10, the electronic component 12 may be a die. The interposer 14 may segregate the warpage that occurs in the die 12 area from warpage that occurs near the edges of the electronic package 10. The interposer 14 may serve as a stiffener that flattens the electronic package 10 edges and corners. In addition, by using a relatively high strength and high CTE mold material, the electronic package 10 may have lower warpage at both room-temperature and high-temperature when compared to conventional electronic packages. The appropriate mold material that is to be used for the over-mold 15 will depend in part on the types of materials that are used for the substrate 11, the electronic component 12 and the interposer 14.

Figure 3:
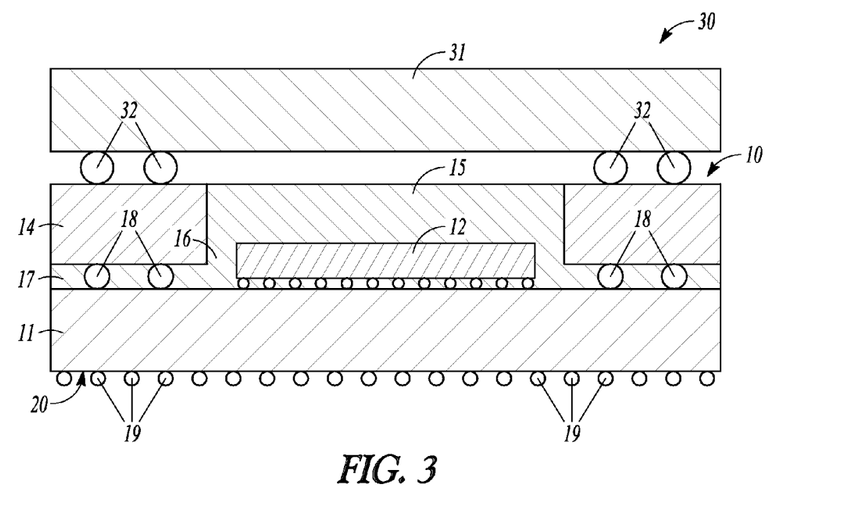
FIG. 3 shows the example electronic package of FIG. 1 incorporated into an electronic assembly.

FIG. 3 shows the example electronic package 10 of FIG. 1 incorporated into an electronic assembly 30. The electronic assembly 30 further includes a second electronic component 31 mounted to the interposer 14.

As an example, the second electronic component 31 may be mounted to the interposer 14 using solder bumps 32. It should be noted that any technique that is known now, or discovered in the future, may be used to mount the second electronic component 31 to the interposer 14.

In addition, the second electronic component 31 may be electrically connected to the substrate 11 through the interposer 14. When the second electronic component 31 is electrically connected to the substrate 11, the second electronic component 31 may be electrically connected to the first electronic component 12 or any other electronic device that is electrically connected to the substrate 11.

In some forms of the electronic assembly 30, the second electronic component 31 may be a DRAM. The type of second electronic component 31 that is included in the electronic assembly 30 will depend in part (i) the type and size of the interposer 14; (ii) the type of substrate 11; and/or (iii) the desired size and functionality of the electronic assembly 30 (among other factors).

The electronic assembly 30 may be well suited for use with a variety of electronic package 10 geometries. As examples, the electronic assembly 30 may provide a robust and scalable solution for manufacturing the electronic assemblies 30 and electronic packages 10 described herein using various die sizes and for incorporation into a variety of different electronic devices.

In addition, the use of the interposer 14 may permit the use of a smaller pitch (e.g., <0.4 mm) for the electrical connections between the interposer 14 and the substrate 11 no matter what type of second electronic component 31 (e.g., DRAM) may be required for the electronic assembly 30. Using a smaller pitch for electrical connections between the interposer 14 and the substrate 11 may also promote design freedom for the electronic assembly 30 and may improve electrical performance.

Figure 4:
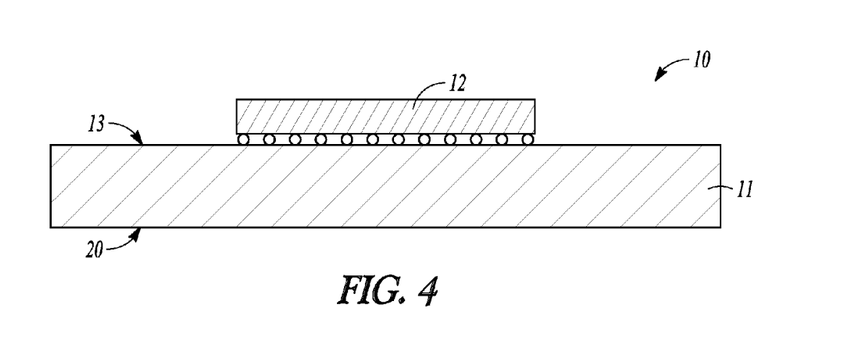
FIG. 4 illustrates an example die mounted on to a substrate to form an electronic package.
Figure 5:
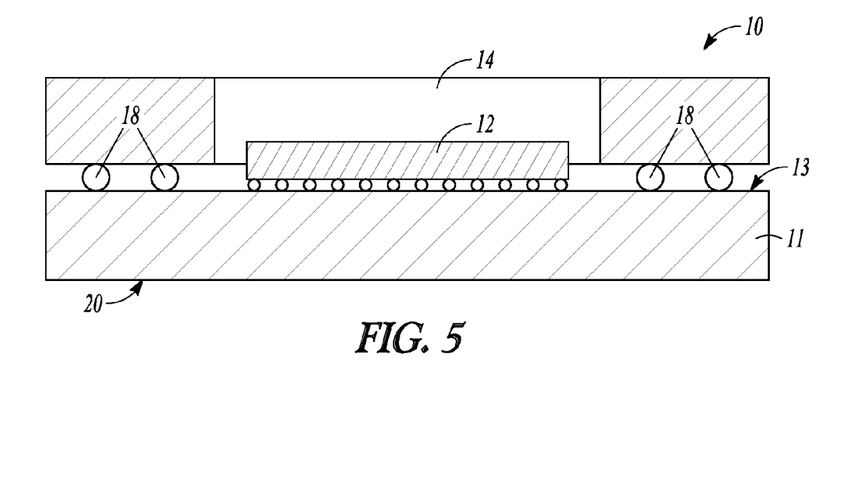
FIG. 5 shows the electronic package illustrated in FIG. 4 with an interposer mounted to the substrate about the periphery of the die.
Figure 6:
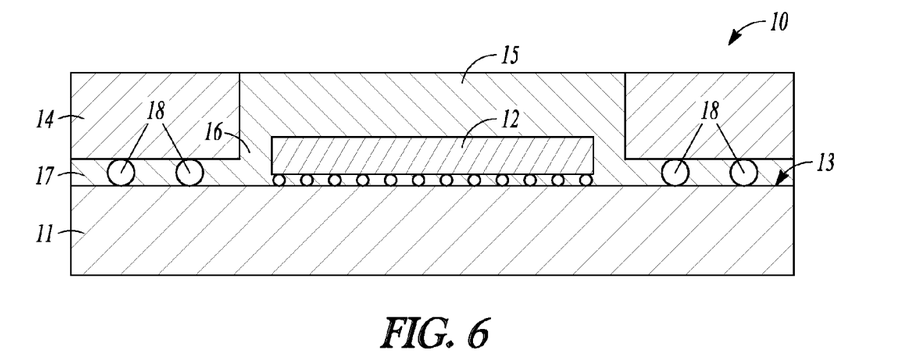
FIG. 6 shows the electronic package illustrated in FIG. 5 with an over-mold added to cover the die.
Figure 8:
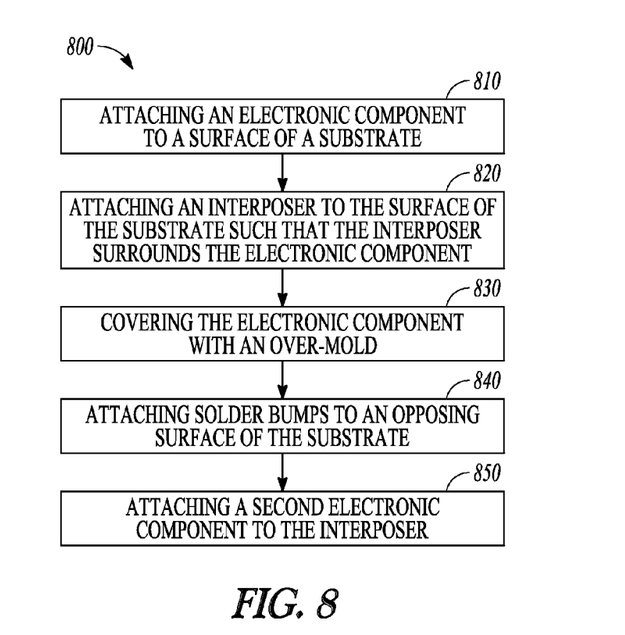
FIG. 8 is a flow diagram illustrating a method of fabricating an electronic package and/or an electronic assembly.

FIG. 8 is a flow diagram illustrating a method [800] of fabricating an electronic package 10 and/or an electronic assembly 30. The method [800] includes [810] attaching an electronic component 12 (e.g., a die) to a surface 13 of a substrate 11 (see FIG. 4). The method [800] further includes [820] attaching an interposer 14 to the surface 13 of the substrate 11 such that the interposer 14 surrounds the electronic component 12 (see FIGS. 5) and [830] covering the electronic component with an over-mold 15 (see FIG. 6).

In some forms of the method [800], [820] attaching the interposer 14 to the surface 13 of the substrate 11 may include attaching the interposer 14 to the substrate 11 with solder bumps 18 (among other types of attachment). In addition, [830] covering the electronic component 11 with an over-mold 15 may include filling in an area 16 between the electronic component 11 and the interposer 14 and may further include filling in an area 17 between the substrate 11 and the interposer 14.

Figure 7:
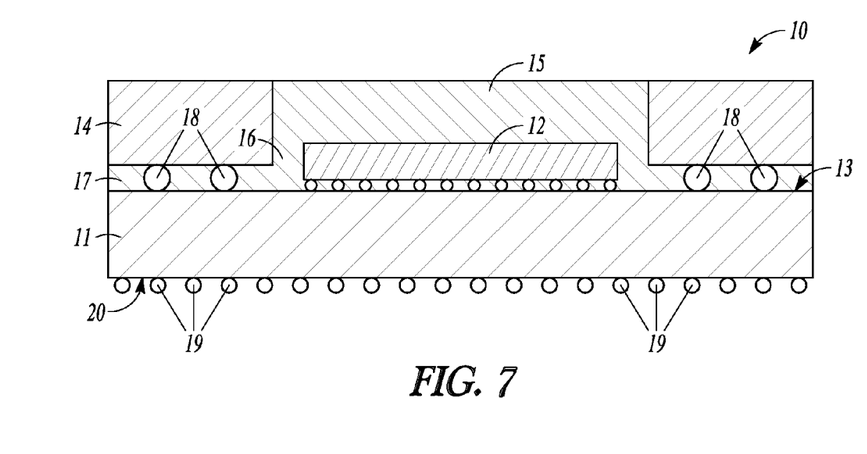
FIG. 7 shows the electronic package illustrated in FIG. 6 with solder balls mounted on an opposing surface of the substrate.

As shown in FIGS. 7 and 8, the method [800] may further include [840] attaching solder bumps 19 to an opposing surface 20 of the substrate 11. The solder bumps 19 may be used to mount (and electrically connect) the electronic package 10 to another electronic device (not shown). The number, size and arrangement of the solder balls 19 will depend in part on the configuration of the electronic device that receives the electronic package 10 (among other factors).

As shown in FIGS. 3 and 8, the method [800] may further include [850] attaching a second electronic component 31 to the interposer 14. As an example, [850] attaching the second electronic component 31 to the interposer 14 may include attaching a DRAM 31 to the interposer 14 using solder bumps 32.

The methods [800] described herein may eliminate TSBA and TMI drilling processes that are typically used in conventional methods of fabricating electronic packages and electronic assemblies. Eliminating TSBA and TMI drilling processes may be beneficial because of the drawbacks that are associated performing these drilling processes during fabrication of electronic packages and electronic assemblies.

Some of the example electronic packages, electronic assemblies and methods described herein may improve yield when mounting a DRAM to an electronic package when using SMT, especially because using example electronic packages, electronic assemblies and methods described herein may (i) allow solder ball self-alignment in x-y plane; and/or (ii) improve solder ball collapse in z direction.

The example electronic packages, electronic assemblies and methods described herein may eliminate through mold interconnects but still use over-mold in the electronic package for warpage control. The interposer 14 may provide a flat interface between the substrate 11 and the DRAM thereby allowing full collapse of DRAM for in-plane self-alignment, which will greatly improve yield when mounting a DRAM to the rest of an electronic package when using SMT.

Besides providing a flat surface for mounting a DRAM by using SMT, the interposer 14 may also serve as stiffener. Therefore, the interposer 14 may reduce electronic package warpage and reduce electronic package thickness. The example electronic packages, electronic assemblies and methods described herein may provide advantages over conventional electronic package techniques in terms of yield, warpage, z-height and fine pitch between electronic components.

Figure 9:
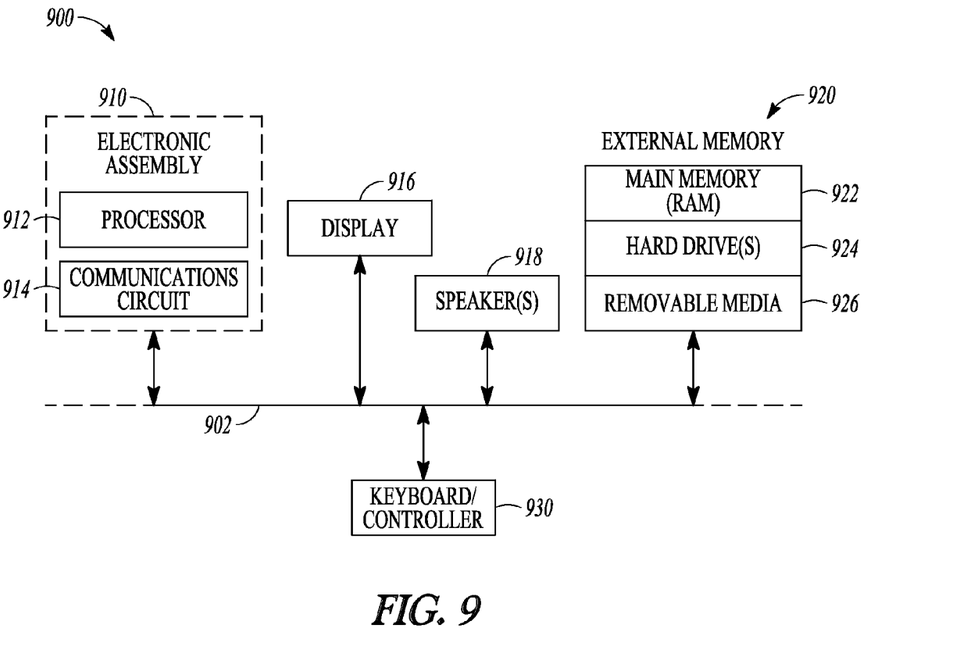
FIG. 9 is block diagram of an electronic apparatus that includes the methods, electronic assemblies and/or the electronic packages described herein.

FIG. 9 is a block diagram of an electronic apparatus 900 incorporating at least one method [800], electronic assembly 30 and/or electronic package 10 described herein. Electronic apparatus 900 is merely one example of an electronic apparatus in which forms of the methods [800], electronic assemblies 30 and/or electronic packages 10 described herein may be used. Examples of an electronic apparatus 900 include, but are not limited to, personal computers, tablet computers, mobile telephones, game devices, MP3 or other digital music players, etc. In this example, electronic apparatus 900 comprises a data processing system that includes a system bus 902 to couple the various components of the electronic apparatus 900. System bus 902 provides communications links among the various components of the electronic apparatus 900 and may be implemented as a single bus, as a combination of busses, or in any other suitable manner.

An electronic assembly 910 as describe herein may be coupled to system bus 902. The electronic assembly 910 may include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 910 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic apparatus 900 may also include an external memory 920, which in turn may include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic apparatus 900 may also include a display device 916, one or more speakers 918, and a keyboard and/or controller 930, which can include a mouse, trackball, touch screen, voice-recognition device, or any other device that permits a system user to input information into and receive information from the electronic apparatus 900.

To better illustrate the methods [800], electronic assemblies 30 and/or electronic packages 10 disclosed herein, a non-limiting list of examples is provided here:

Example 1 includes an electronic package that includes a substrate and an electronic component mounted to a surface of the substrate. The electronic package further includes an interposer mounted to the surface of the substrate such that the interposer surrounds the electronic component and is electrically connected to the substrate. An over-mold covers the electronic component.

Example 2 includes the electronic package of example 1, wherein the substrate is a motherboard.

Example 3 includes the electronic package of any one of examples 1-2, wherein the interposer is formed of organic polymers, fibers and conductors.

Example 4 includes the electronic package of any one of examples 1-3, wherein the over-mold is formed of a polymer.

Example 5 includes the electronic package of any one of examples 1-4, wherein the over-mold fills an area between the electronic component and the interposer.

Example 6 includes the electronic package of examples 1-5, wherein the over-mold fills the area between the interposer and the substrate.

Example 7 includes the electronic package of any one of examples 1-6, wherein the over-mold fills the area between the interposer and the substrate.

Example 8 includes the electronic package of any one of examples 1-7, wherein the interposer is mounted to the substrate using solder bumps.

Example 9 includes the electronic package of any one of examples 1-8, and further including solder bumps mounted to an opposing surface of the substrate.

Example 10 includes an electronic assembly that includes a substrate and a first electronic component mounted to a surface of the substrate. The electronic assembly further includes an interposer mounted to the surface of the substrate such that the interposer surrounds the electronic component and is electrically connected to the substrate, and an over-mold that covers the electronic component. A second electronic component mounted to the interposer.

Example 11 includes the electronic assembly of example 10, wherein the second electronic component is mounted to the interposer using solder bumps.

Example 12 includes the electronic assembly of any one of examples 10-11 and further including a third electronic device that is mounted to at least one of the first electronic device and the second electronic device.

Example 13 includes the electronic assembly of examples 10-12, wherein the second electronic component is a DRAM.

Example 14 includes a method of fabricating an electronic package. The method includes attaching an electronic component to a surface of a substrate and attaching an interposer to the surface of the substrate such that the interposer surrounds the electronic component. The method further includes covering the electronic component with an over-mold.

Example 15 includes the method of any one of example 14, wherein attaching an interposer to the surface of the substrate includes attaching the interposer to the substrate with solder bumps.

Example 16 includes the method of any one of examples 14-15, wherein covering the electronic component with an over-mold includes filling in an area between the electronic component and the interposer.

Example 17 includes the method of any one of examples 14-16, wherein covering the electronic component with an over-mold includes filling in an area between the substrate and the interposer.

Example 18 includes a method of fabricating an electronic assembly. The method includes attaching a first electronic component to a surface of a substrate and attaching an interposer to the surface of the substrate such that the interposer surrounds the electronic component. The method further includes covering the first electronic component with an over-mold and attaching a second electronic component to the interposer, Example 19 includes the method of example 18, wherein attaching a second electronic component to the interposer includes attaching a DRAM to the interposer using solder bumps.

Example 20 includes the method of examples 18-19, wherein covering the first electronic component with an over-mold includes filling in a first area between a die and the interposer and filling in a second area between the interposer and the substrate.

These and other examples and features of the present electronic assemblies and electronic packages will be set forth in part in the detailed description.

This overview is intended to provide non-limiting examples of the present subject matter. It is not intended to provide an exclusive or exhaustive explanation. The detailed description is included to provide further information about the methods [800], electronic assemblies 30 and/or electronic packages 10 described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package, comprising:
   a substrate is a motherboard;
   an electronic component in contact with a surface of the substrate such that the electronic component is directly electrically connected to the surface of the substrate;
   an interposer mounted to the surface of the substrate such that the interposer surrounds the electronic component without covering the electronic component and is electrically connected to the substrate; and
   an over-mold that is in direct contact with an upper surface of the electronic component, wherein the over-mold fills the area between the interposer and the substrate.

2. The electronic package of claim 1, wherein the interposer is organic polymers, fibers and conductors.

3. The electronic package of claim 1, wherein the over-mold is a polymer.

4. The electronic package of claim 1, wherein the over-mold fills an area between the electronic component and the interposer.

5. The electronic package of claim 1, wherein the interposer is mounted to the substrate using solder bumps.

6. The electronic package of claim 1, further comprising solder bumps mounted to an opposing surface of the substrate.

7. An electronic assembly, comprising:
   a substrate is a motherboard;
   an first electronic component mounted to a surface of the substrate; an interposer in contact with the surface of the substrate such that the interposer surrounds the electronic component without covering the electronic component, the interposer being electrically connected to the substrate, wherein the electronic component is directly electrically connected to the surface of the substrate;

an over-mold that is in direct contact with an upper surface of the electronic component, wherein the over-mold fills the area between the interposer and the substrate; and a second electronic component mounted to the interposer.

8. The electronic assembly of claim 7, wherein the second electronic component is mounted to the interposer using solder bumps.

9. The electronic assembly of claim 7, wherein the second electronic component is electrically connected to the substrate through the interposer.

10. The electronic assembly of claim 7, wherein the second electronic component is a DRAM.

11. A method of fabricating an electronic package, the method comprising:

providing a substrate, wherein the substrate is a motherboard;

attaching an electronic component to a surface of a substrate such that electronic component is in contact with the surface of the substrate and is directly electrically connected to the surface of the substrate;

attaching an interposer to the surface of the substrate such that the interposer surrounds the electronic component without covering the electronic component; and covering the electronic component with an over-mold such that the over-mold is in direct contact with an upper surface the electronic component, wherein covering the electronic component with an over-mold includes filling in an area between the electronic component and the interposer.

12. The method of claim 11, wherein attaching an interposer to the surface of the substrate includes attaching the interposer to the substrate with solder bumps.

13. The method of claim 11, wherein covering the electronic component with an over-mold includes filling in an area between the substrate and the interposer.

14. A method of fabricating an electronic assembly, the method comprising:

providing a substrate, wherein the substrate is a motherboard;

attaching a first electronic component to a surface of a substrate such that electronic component is in contact with the surface of the substrate and is directly electrically connected to the surface of the substrate;

attaching an interposer to the surface of the substrate such that the interposer surrounds the electronic component;

covering the first electronic component with an over-mold such that the over-mold is in direct contact with an upper surface the electronic component; and attaching a second electronic component to the interposer, wherein covering the first electronic component with an over-mold includes filling in a first area between a die and the interposer and filling in a second area between the interposer and the substrate.

15. The method of claim 14, wherein attaching a second electronic component to the interposer includes attaching a DRAM to the interposer using solder bumps.

* * * * *